United States Patent [19]

Gazit et al.

[11] Patent Number: 4,634,631
[45] Date of Patent: Jan. 6, 1987

[54] FLEXIBLE CIRCUIT LAMINATE AND METHOD OF MAKING THE SAME

[75] Inventors: Samuel Gazit, Willimantic; Cathy A. Fleischer, Thompson, both of Conn.

[73] Assignee: Rogers Corporation, Rogers, Conn.

[21] Appl. No.: 755,074

[22] Filed: Jul. 15, 1985

[51] Int. Cl.[4] .......................... B32B 27/08; B32B 15/08
[52] U.S. Cl. .................................... 428/421; 428/422; 428/432; 428/463; 428/473.5; 428/901
[58] Field of Search ............ 428/422, 421, 901, 473.5, 428/432, 463

[56] References Cited

U.S. PATENT DOCUMENTS 3,676,566  7/1972  McBride ...................... 428/473.5 X
3,770,566 11/1973  Gerow et al. ................... 428/421 X
4,050,976  9/1977  Reiters ........................... 428/901 X
4,431,698  2/1984  Case et al. ...................... 428/422 X Primary Examiner—Thomas J. Herbert
Attorney, Agent, or Firm—Fishman & Dionne

[57] ABSTRACT

A flexible circuit laminate is presented comprising a microglass reinforced fluoropolymer layer sandwiched between a polyimide substrate and a copper conductive pattern. The glass reinforced fluoropolymer acts as a high bond strength adhesive between the polyimide and copper conductive pattern. The glass reinforced fluoropolymer also contributes to improved dimensional stability as well as improved electrical performance. Preferably, the microglass content is between about 4 to about 30 weight percent, and more preferably about 20 weight percent glass. In a method of making the flexible circuit laminate, the polyimide substrate undergoes a preferably alkaline microetching surface treatment, followed by rinsing, drying and lamination to the microglass reinforced fluoropolymer and copper layers.

15 Claims, 10 Drawing Figures

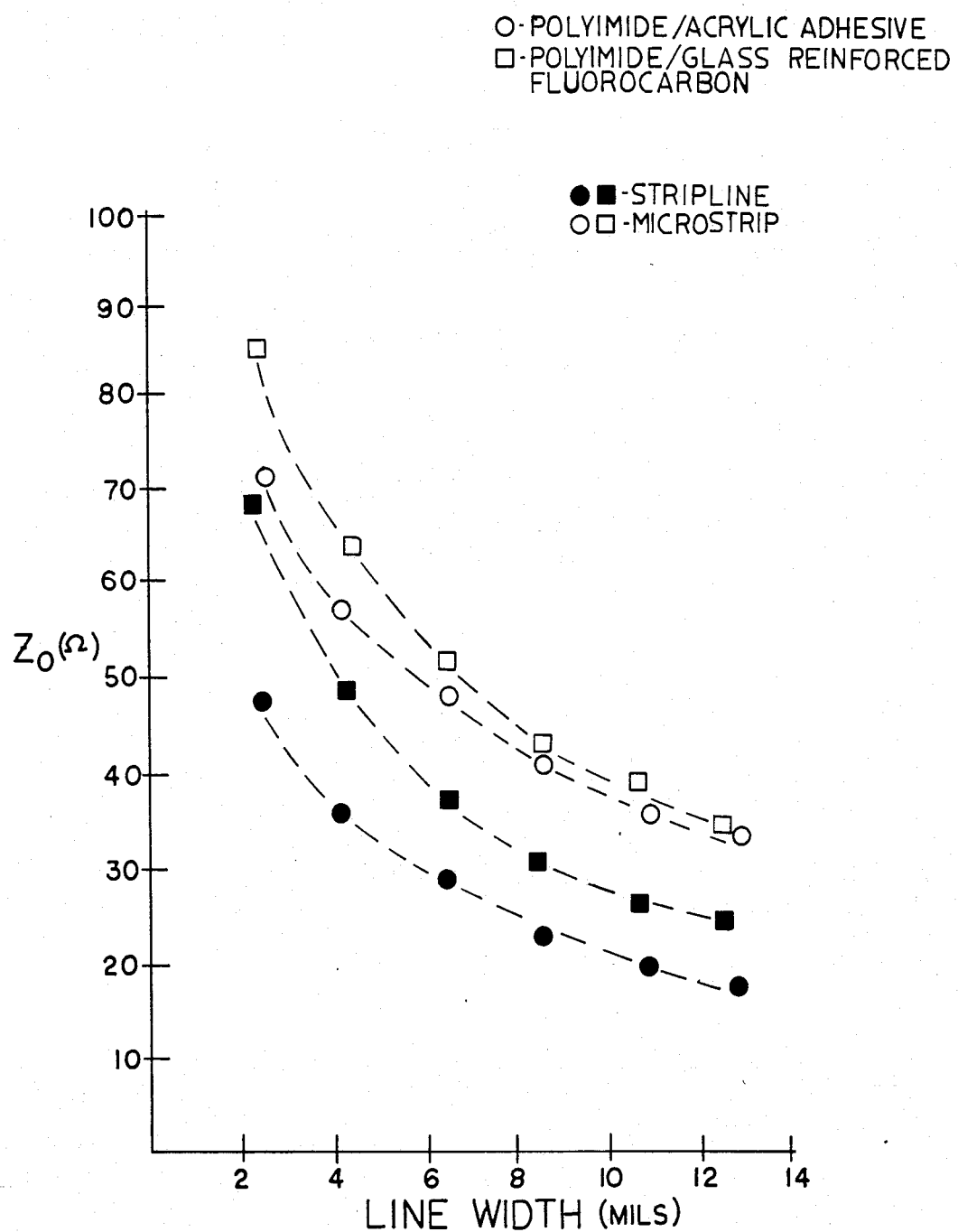

FLEXIBLE CIRCUIT LAMINATE AND METHOD OF MAKING THE SAME

BACKGROUND OF THE INVENTION

This invention relates to the field of laminar sheet material. More particularly, this invention relates to the field of laminar circuit sheet material comprised of a fluoropolymer/glass composite layer sandwiched between a polyimide film and a copper foil.

Conventional flexible circuitry comprised of polyimide film such as DuPont's Kapton film adhesively bonded to thin metal foil, usually copper, is well known to those skilled in the art. Typically, a conductor pattern is printed on the copper with an etch resistant coating, the unnecessary copper subsequently being etched away. While finding great application, this conventional flex circuitry suffers from certain drawbacks and deficiencies. For example, substrate materials having lower dielectric constants will offer less interference to electronic signals traveling through the conductors especially at high frequency. The dielectric constant of conventionally used polyimide substrate film such as Kapton, is typically 3.5 (dielectric constant of Kapton is dependent on humidity). With the increasing use of high speed signals, the relatively high dielectric constant of polyimide substrates create undesirable effects. Consequently, a substrate material having a lower dielectric constant, i.e., less than about 2.5, would be highly desirable from at least the standpoint of offering less resistance to electronic signals.

Another common problem with polyimide based flex circuitry is found in the necessary adhesive associated therewith. Adhesives between the polyimide film and copper conductors may be adversely affected by high temperature.

One way of overcoming the above discussed resistance problem is to cover the polyimide film with a material having a relatively lower dielectric constant and which does not need an adhesive bond. Fluoropolymers are materials which satisfy these two requirements. In fact, laminar structures of polyimide and fluorocarbon polymers have been described in U.S. Pat. Nos. 3,676,566 and 3,770,566 assigned to E. I. duPont de Nemours and Company. Commercially, polyimide/fluoropolymer laminates are well known and available from the E. I. duPont de Nemours and Company under the trademarks Kapton F and Kapton XP.

Unfortunately, while fluoropolymer coated polyimides (such as Kapton F or Kapton XP) provide an improved, i.e., lower, dielectric constant than conventional polyimide (Kapton) film coated with an acrylic or epoxy adhesive, other serious problems associated with fluoropolymers are presented. The two most important problems involve poor dimensional stability of the fluoropolymer and poor adhesion or bond strength between the copper conductors and the fluoropolymer film.

In an effort to overcome these problems, U.S. patent application Ser. No. 629,164, now abandoned and U.S. patent application Ser. No. 755,067, (which is a continuation-in-part of U.S. Ser. No. 629,164 and is being filed contemporaneously with the present application), both of which are assigned to the assignee hereof and incorporated herein by reference, provide a laminar circuit sheet material wherein a layer of microglass reinforced fluoropolymer is sandwiched between a fluoropolymer coated polyimide laminate, i.e., Kapton F or Kapton XP, and a copper conductive pattern. In essence, the fluoropolymer/microglass film of the present invention acts as a bonding layer or adhesive which greatly improves the bond strength between, for example, the Kapton F or XP and the etched copper conductors.

Moreover, use of microglass reinforced fluoropolymer film not only improves the bond between, for example, Kapton F or XP and copper foil, but also, and just as significantly, improves the overall dimensional stability of the laminate. This improved dimensional stability is of particular importance, since, as mentioned, fluoropolymers (and even polyimide) suffer from poor and at times, unacceptable dimensional stability. Furthermore, the microglass reinforced fluoropolymer bonding layer also provides improved temperature characteristics to the laminated circuit sheet of the present invention.

Thus, the laminate circuit material disclosed in U.S. patent application Ser. No. 629,164 results in a lower dielectric constant relative to conventional polyimide (Kapton) film based flexible circuit material due to the presence of the fluoropolymer. Also, the dimensional stability and bond strength to copper foil in the laminate of the instant invention are improved relative to fluoropolymer coated polyimides such as Kapton F or XP.

However, while suitable for its intended purposes, the laminate circuit material disclosed in U.S. Ser. No. 629,164 suffers from several deficiencies and disadvantages including, but not limited to the following:

(1) The laminate circuit material of U.S. Ser. No. 629,164 is relatively thick due to the presence of both fluoropolymer and fluoropolymer adhesive layers.

(2) The layer(s) of fluoropolymer film provide decreased dimensional stability.

(3) The cost of fluoropolymer coated polyimides such as Kapton F or XP is quite expensive.

(4) The overall quality of the laminate product may be difficult to control.

SUMMARY OF THE INVENTION

The above discussed and other problems of the prior art are overcome or alleviated by the laminar circuit sheet metal of the present invention. In accordance with the present invention, a flexible circuit laminate is provided comprising a microglass reinforced fluoropolymer layer sandwiched between a polyimide substrate and a copper conductive pattern. The glass reinforced fluoropolymer acts as a high bond strength adhesive between the polyimide and copper conductive pattern. The glass reinforced fluoropolymer also contributes to improved dimensional stability as well as improved electrical performance. Preferably, the microglass content is between about 4 to about 30 weight percent, and more preferably about 20 weight percent glass. In a method of making the flexible circuit laminate, the polyimide substrate undergoes a preferably alkaline microetching surface treatment, followed by rinsing, drying and lamination to the microglass reinforced fluoropolymer and copper layers.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 10 is a graphical representation of characteristic impedance vs line width for stripline and microstrip constructions of both the present invention and the prior art laminate of FIG. 1.

DESCRIPTION OF THE PREFERRED EMBODIMENT

Figure 1:
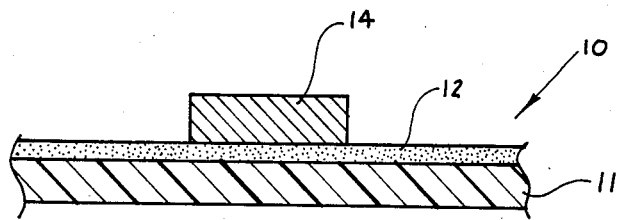
FIG. 1 is a cross-sectional elevation view of a copper/adhesive/polyimide laminate in accordance with the prior art.
Figure 2:
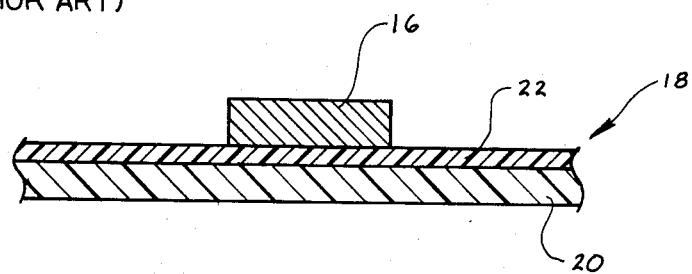
FIG. 2 is a cross-sectional elevation view of a copper/fluorocarbon/polyimide laminate in accordance with the prior art.
Figure 3:
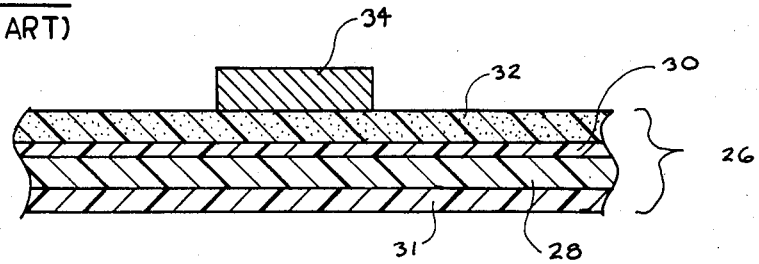
FIG. 3 is a cross-sectional elevation view of a copper/glass reinforced fluorocarbon/fluorocarbon/polyimide laminate in accordance with the prior art.

Referring first to FIGS. 1-3, three examples of prior art laminar circuit sheet materials are shown. In FIG. 1, a conventional flexible circuit sheet is shown having a substrate or base layer 10 comprised of a polyimide film 11 such as Kapton film bonded by a generally acrylic or epoxy adhesive 12 to a copper conductor 14. As already mentioned, this conventional flex circuitry is associated with certain problems and deficiencies. One such problem is the relatively high dielectric constant of the Kapton film, i.e., typically 3.5, and of the adhesive layer. It is well known that lowering the dielectric constant of the circuit substrate material will result in less interference of the base material with the electronic signals passing through the copper conductors at high frequency. It would be advantageous therefore, to improve conventional flex circuitry such as shown in FIG. 1 by lowering the dielectric constant of the substrate material. Another problem associated with the flex circuitry of FIG. 1 is the adhesive layer 12. Adhesive materials in the circuit laminate may be adversely affected by high temperatures.

One attempt at overcoming the deficiencies of the circuit laminate of FIG. 1 is shown by the fluorocarbon containing circuit laminate of FIG. 2. In FIG. 2, a copper conductor 16 is positioned on a substrate material 18 comprised of a polyimide film 20 such as Kapton having a layer of fluorocarbon film 22 thereon. Substrate layer 18 is a well known material commercially available as KAPTON F (hereinafter referred to as KF) or KAPTON XP (hereinafter referred to as KXP) manufactured by the E. I. duPont De Nemours & Co. KAPTON F is comprised of a KAPTON polyimide film Type H coated on one or two sides with TEFLON FEP fluorocarbon resin. Kapton XP is comprised of a Kapton Polyimide film Type H coated on one or two sides with TEFLON PFA fluorocarbon resin. Fluorocarbon polymers have a relatively low dielectric constant, i.e., less than 2.5 and high temperature characteristics. Accordingly, substrate material 18 will exhibit improved dielectric characteristics, i.e., a lower dielectric constant relative to other conventional substrates such as substrate material 10 in FIG. 1. Moreover, substrate 18 does not necessitate an intermediate adhesive layer and the problems associated therewith as the thermoplastic fluorocarbon polymer acts as its own adhesive material.

However, while providing some improved characteristics over the FIG. 1 prior art, the fluorocarbon/polyimide substrate 18 of FIG. 2 suffers from certain other important deficiencies. For example, while the fluorocarbon polymer 22 imparts improved dielectric characteristics and obviates the need for adhesive, it is well known that fluorocarbon polymeric materials exhibit extremely poor dimensional stability and relatively poor bond strength (i.e., peel strength) to copper. Obviously, these negative features of fluorocarbons are imparted to substrate 18. Even the composite dielectric materials of Kapton and fluorocarbon such as Kapton F and Kapton XP suffer from poor dimensional stability and poor bonding to copper conductors.

The prior art laminar circuit sheet material disclosed in U.S. patent application Ser. No. 629,164 attempts to overcome the problems associated with the prior art circuit materials in both FIGS. 1 and 2 by providing a glass reinforced fluorocarbon layer between, for example, the substrate material 18 and the copper conductor 16 in FIG. 2. This glass reinforced fluorocarbon polymer functions to improve the circuit material of FIG. 2 in at least two respects. First, the additive layer acts as an adhesive and greatly improves the bond strength between the copper and teflon coated Kapton. Second, dimensional stability of the laminate is dramatically improved, while retaining the improved electrical properties. Referring now to FIG. 3, one embodiment of the laminar circuit material of U.S. Ser. No. 629,164 is shown. In FIG. 3, substrate 26 is comprised of a polyimide film 28 sandwiched between two layers of polyfluorocarbon film 30 and 31, film 30, in turn, having a layer of microglass reinforced fluorocarbon polymer 32 thereon. Finally, copper conductor 34, is laminated to the novel microglass fluoropolymer layer 32. It will be appreciated that polyimide film 28 and polyfluorocarbon layer 30 is analogous to the substrate 18 (Kapton F or Kapton XP) of FIG. 2. It will also be appreciated that polyfluorocarbon film 31 is an optional layer and may not be necessary for many constructions and applications.

While suitable for its intended purposes, the laminar circuit sheet material of application Ser. No. 629,164 suffers from several deficiencies. For example, the presence of the fluorocarbon layers 30 and 31 both increase the thickness of the overall laminate as well as decrease the dimensional stability thereof. Also, fluorocarbon coated polyimide such as Kapton F or Kapton XP is relatively expensive and therefore the overall cost of the circuit laminar sheet material of prior art FIG. 3 may be prohibitively expensive.

Figure 4:
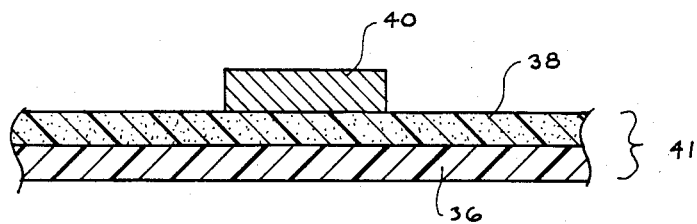
FIG. 4 is a cross-sectional elevation view of a copper/glass reinforced fluorocarbon/polyimide laminate in accordance with the present invention.

Turning now to FIG. 4, an embodiment of the present invention is shown. It is believed that the circuit sheet laminate material of the present invention is an improvement over the circuit sheet laminate material disclosed in application Ser. No. 629,164. The circuit material of the present invention includes a base or substrate comprised of a polyimide film 36 having a layer of microglass reinforced fluorocarbon polymer 38 thereon. Finally, an electrical conductive material such as copper 40 is laminated to the microglass fluoropolymer layer 38. In effect, the novel circuit laminate of the present invention is similar to the circuit material shown in prior art FIG. 3 with the exception that the two layers of fluorocarbon 30 and 31 are no longer necessitated. As a consequence, the present invention provides reduced thickness, increased dimensional stability, lower cost and better quality control than is available with the circuit material disclosed in application Ser. No. 629,164.

FIGS. 5–8 are alternative embodiments of other laminar circuit sheet materials in accordance with the present invention. It should be understood that all of these embodiments have in common the basic laminate composition 41 of a polyimide base having glass reinforced fluoropolymer thereon shown in FIG. 4.

Figure 5:
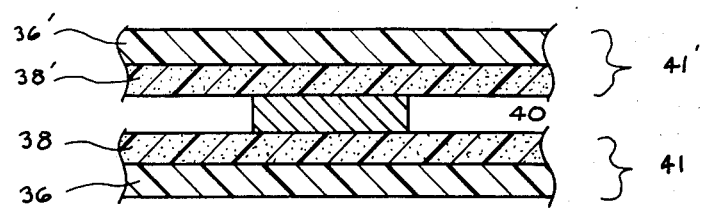
FIG. 5 is a cross-sectional elevation view of another embodiment of a circuit laminate material in accordance with the present invention.

In FIG. 5, the flex circuit of FIG. 4 is provided with an identical laminated structure 41' sandwiching the copper conductor 40 therebetween. The flex circuit of FIG. 5 is a "non shielded" laminate construction with a cover film.

Figure 6:
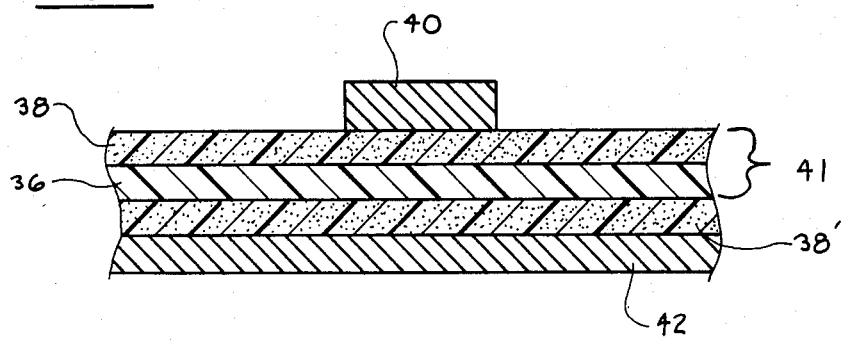
FIG. 6 is a cross-sectional elevation view of still another embodiment of the circuit laminate material in accordance with the present invention.

The embodiment of FIG. 6 is similar to FIG. 4, except for the added metal conductive layer 42 and adhesive layer 38'. This configuration is known in the art as a microstrip without coverfilm. It will be appreciated that the microglass reinforced polyfluorocarbon layer 38' provided between conductive layer 42 and polyimide layer 36 will be equally effective in improving bonding and dimensional stability.

Figure 7:
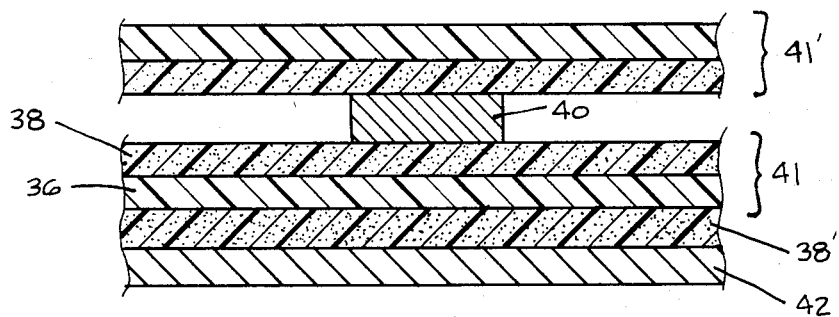
FIG. 7 is a cross-sectional elevation view of yet another embodiment of the circuit laminate material in accordance with the present invention.

FIG. 7 is a microstrip configuration similar to FIG. 6, but including the coverfilm layer 41' of FIG. 5. Thus, a conductive layer 42' has been added to the lower surface of polyimide layer 36 with an additional layer of glass reinforced fluorocarbon 38' being provided between layers 36 and 42'.

Figure 8:
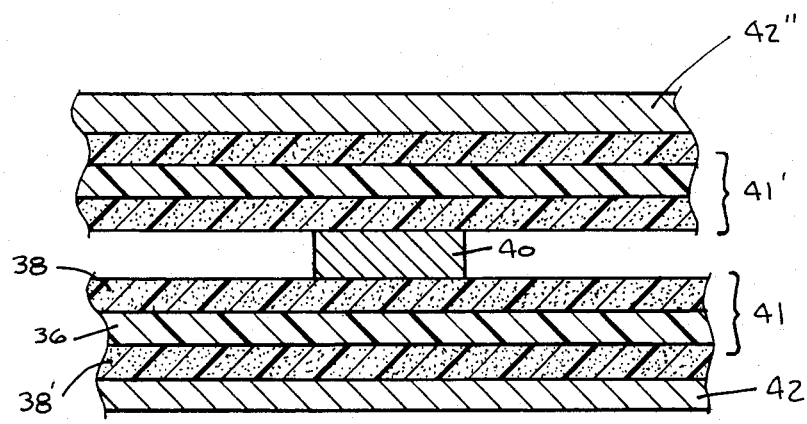
FIG. 8 is a cross-sectional elevation view of still another embodiment of the circuit laminate material in accordance with the present invention.

Finally, in FIG. 8, an additional copper or other metal sheet 42' has been added to the microstrip laminate of FIG. 7 to form a well known stripline configuration with a glass reinforced fluoropolymer layer 38" being sandwiched between conductive sheet 42" and laminated structure 41'. Both microstrip and stripline laminate configurations find great use in applications which require high electronic signal speed and preferably substrates having low dielectric constants. Accordingly, the circuit laminate of the present invention is extremely well suited for electronic devices and other applications using high speed digital signals.

In a preferred embodiment of the present invention, the polyimide layer and the glass reinforced fluoropolymer layer have thickness of about 25–50 μm while the copper conductor has a thickness of about 17–32 μm.

A few examples of fluoropolymers which may be used in conjunction with the present invention include a terpolymer of tetrafluoroethylene (TFE), hexafluoropropylene (HFP) and perfluorovinylether (PVE) which is commercially available under the tradenames PFA (DuPont) and TFA (Hoechst). Another suitable fluoropolymer is a copolymer of TFE and hexafluoropropylene (HFP) which is commercially available from the DuPont Company under the tradename FEP. Micro glass fibers are used in the PFA, TFA and FEP materials to provide dimensional stability.

It is well known that such microglass has a short, noncontinuous configuration (as opposed to continuous glass fibers or strands). Preferably, 20 weight percent microglass should be used in connection with the fluoropolymer layer, although 4–30 weight percent have also resulted in improved bonding. It will be appreciated that higher amounts of glass will reduce the overall flexibility of the circuit laminate. In order to maintain requisite flexibility, the thickness of each layer in the laminate should be minimized. The glass reinforced materials are designated herein as PFAg, TFAg and FEPg. The glass reinforced materials may be produced by a paper process or by extrusion.

Figure 9:
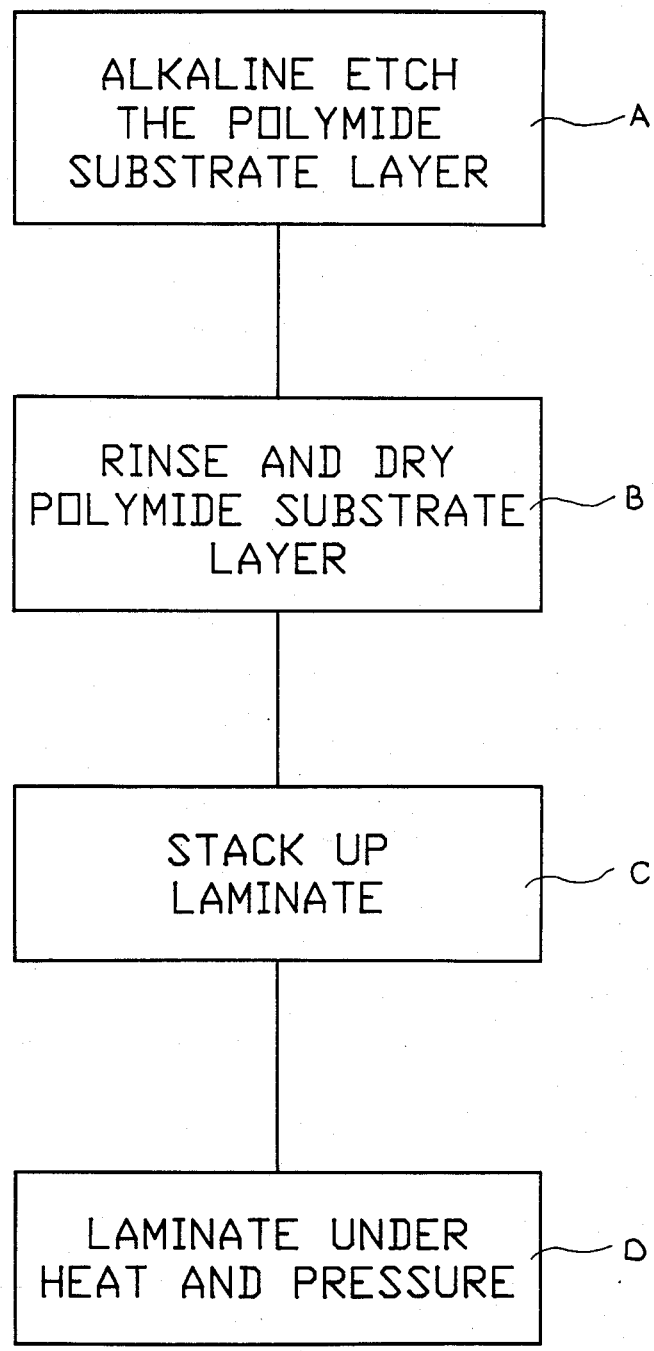
FIG. 9 is a flow chart diagram of a method of making the copper/glass reinforced fluorocarbon/polyimide laminate in accordance with the present invention.

A preferred method of making the circuit laminate material of the present invention is illustrated by the flow diagram of FIG. 9. While the polyimide, glass reinforced fluoropolymer and copper layers may be directly laminated (at for example, 4 MPa (600 PSI) and 405° C. (760° F.) resulting in a bond strength of 3–10 N/cm (5–8 pli)), initial surface treating of the polyimide layer further enhances the bond strength and is therefore preferred. This surface treating provide a micro etching (i.e., texturing) to the surface of the polyimide. It has been found that an alkaline surface treatment of the polyimide surface provides the best results. The most successful to date, are KOH in ethanol/water and KOH in ethylene diamine (ETDA)/water. KOH concentrations between 0.1N–2N, ETDA concentrations of 15–35% by volume and ethanol concentrations of 70–90% are preferred. Samples should be dipped in solution for 10–30 seconds, rinsed and dried. The materials are laminated together at high temperature (340°–400° C.) and pressure (2–4 MPa). The laminate is heated up in the press, held at temperature for one hour, cooled to 200° C. and then transferred to a cold press at the same pressure. Thus, as shown in FIG. 9, the preferred method of constructing the laminate of the present invention comprises the steps of alkaline etching the polyimide substrate (Step A) followed by rinsing and drying the polyimide (Step B). Next, the laminate is stacked up, for example in any of the configurations shown in FIGS. 4–8 (Step C) followed by lamination under heat and pressure (Step D).

The following Examples provide support for the improved mechanical and electrical properties of the present invention. The polyimide treatments consisted of either treatment #1 which was a 30 second dip in a 1N KOH in ethanol/water (80/20) or treatment #2 which was a 15 second dip in a 1N KOH in ethylene diamine/water (15–85).

I. MECHANICAL PROPERTIES

A. Bond or Peel Strength

In the following examples 1 and 2, the bond or peel strength between the copper foil conductors and the dielectric laminate material of the present invention were measured for a variety of laminate materials. The experiments were conducted in accordance with the Institute of Interconnecting and Packaging Electronic Circuits (IPC) Test Method No. 2.4.9, Revision A, dated December 1982, the contents of which are incorporated herein by reference.

Referring to TABLE I, the peel strength results clearly reveal the improved bonding which the micro etching imparts to the laminate material relative to unetched polyimide. A consistent peel strength between the copper and polyimide of above 14 N/cm (8 pli) is an important feature of the present invention.

TABLE I

(BOND OR PEEL STRENGTH)

| Laminating Temperature °C. (°F.) | Conditions Pressure MPa (PSI) | Kapton Treatment | Peel Strength N/cm (pli) | Approximate dielectric thickness μM (mils) |
|---|---|---|---|---|
| Example 1: KAPTON/Glass reinforced PFA/Copper (FIG. 4) | | | | |
| 405 (760) | 4 (600) | none | 8.2 ± 1.2 (4.7 ± .7) | 76 (3.0) |
| | | #1 | 15.2 ± 1.2 (8.7 + .7) | 96 (3.8) |
| | | #2 | 16.1 ± .2 (9.2 ± .1) | 66 (2.6) |
| Example 2: KAPTON/Glass reinforced TFA/Copper (FIG. 4) | | | | |
| 345 (650) | 4 (600) | none | 9.3 ± .5 (5.3 ± .3) | 94 (3.7) |
| | | #1 | 15.0 ± .3 (8.6 ± 2) | 91 (3.6) |
| | | #2 | 14.7 ± .2 (8.4 ± .1) | 91 (3.6) |

B. Dimensional Stability

In Examples 3 and 4, the dimensional stability of fluoropolymer/polyimide laminates in accordance with the present invention were conducted in accordance with the IPC Test Method No. 2.2.4, Revision A, dated December, 1982, the contents of which are incorporated herein by reference.

Referring to TABLE II, the results therein show excellent dimensional stability with dimensional changes of less than 0.2%.

TABLE I

(DIMENSIONAL STABILITY)

| Laminating Temperature °C. (°F.) | Conditions Pressure MPa (psi) | Kapton Treatment | Approximate dielectric thickness μM (mils) | % Dimensional change Machine direction (cross machine direction) |
|---|---|---|---|---|
| Example 3: KAPTON/Glass reinforced PFA/Copper | | | | |
| 380 (720) | 4 (600) | #1 | 64 (2.5) | −.18 ± .02 (−.21 ± .02) |
| Example 4: KAPTON/Glass reinforced TFA/Copper | | | | |
| 360 (675) | 4 (600) | #1 | 84 (3.3) | −.21 ± .02 (−.15 ± .03) |

C. Flexibility

In Examples 5 and 6, the flexibility of the present invention was measured in accordance with the IPC Test Method No. 2.4.3, Revision A, dated December 1982, the contents of which are incorporated herein by reference.

Referring to TABLE III, the results therein show reasonably good numbers of flexes before failure. The results also show that thinner materials have an increased number of flexes before failure.

TABLE III

(FLEXIBILITY)

| Laminating Temperature °C. (°F.) | Conditions Pressure MPa (psi) | Kapton Treatment | Approximate dielectric thickness μM (mils) | Flex cycles to failure circuit out ave (circuit inside) |
|---|---|---|---|---|
| Example 5: KAPTON/glass reinforced PFA/Copper | | | | |
| 405 (760) | 4 (600) | #1 | 68 (2.7) | 3450 (3600) |
| Example 6: KAPTON/glass reinforced TFA/Copper | | | | |
| 360 (675) | 4 (600) | none | 84 (3.3) | 1850 (1200) |

II. Electrical Properties

The contributions of the glass reinforced flouropolymer layer(s) to the improved electrical properties of the circuit laminate described herein is a significant feature of the present invention. As a signal pulse travels along a conductor in a circuit, the electrical and magnetic fields generated by the pulse extend into the dielectric materials surrounding the conductor. The fields are strongest at the conductor/dielectric interface and become weaker as distance from the conductor increases. The properties of the dielectric material closest to the conductor therefore have the greatest affect on these fields and hence on the electrical properties (propagation velocity, impedance, etc.) of the circuit.

A. Effective Dielectric Constant

This significant electrical characteristic of laminate circuit materials is clearly shown in the following TABLE IV wherein the effective dielectric constant of a stripline circuit such as described in FIG. 1 (i.e., polyimide/acrylic adhesive/copper) is compared to the effective dielectric constant of a stripline circuit in accordance with the present invention (FIGS. 8 or 8A). Dielectric constant is a physical property, and therefore characteristic of a material. However, the effective dielectric constant ($\epsilon$eff) gives a dielectric constant value for the material in which the electrical and magnetic fields of the signal pulse travel. In the stripline configuration, these fields are contained in the dielectric material between the ground planes. Therefore, the stripline values for effective dielectric constant are closest to the dielectric constant of the substrate. In microstrip and coplanar constructions, the electrical and magnetic fields extend into air. The microstrip and coplanar values of $\epsilon$eff reflect the combination of the dielectric constants of air ($\epsilon_r \approx 1$) and the dielectric material. In the coplanar construction, the contribution of air is dominant. TABLE IV shows that a significantly lower effective dielectric constant results with the present invention due to the glass reinforced fluorocarbon layer.

TABLE IV

| Effective Dielectric Constant (εeff) for Stripline Circuit Constructions | |
|---|---|
| Substrate | εeff |
| Kapton + Acrylic Adhesive | 3.1 |
| Kapton + glass reinforced fluorocarbon | 2.5 |

B. Characteristic Impedance

The characteristic impedance ($Z_o$) of a conductor in a circuit is a function of the width of the conductor, the dielectric thickness (between the conductor and the ground), and the electrical properties of the dielectric material. FIG. 10 is a graph plotting characteristic impedance vs. line width for stripline and microstrip constructions of a circuit laminate in accordance with the present invention and a laminate material similar to the prior art laminate of FIG. 1. The results set forth in FIG. 10 indicate at least the following:

(a) Zo increases with decreasing line width
(b) Characteristic impedance of a given conductor is higher in microstrip than in stripline constructions.
(c)

For the same line width and dielectric thickness, the lower the εeff the higher is the characteristic impedance. Therefore, lower εeff materials, such as the circuit laminate of the present invention have an advantage in circuit manufacturing (the subtractive process) because they can meet impedance specifications using wider lines, which are easier to manufacture.

In summary, the glass reinforced fluoropolymer layer of the present invention laminated with a polyimide such as Kapton and a suitable conductive copper film will provide dramatic improvements and features over all three prior art circuit laminates shown in FIGS. 1-3. Thus, when compared to the polyimide/adhesive/copper laminate (adhesives as discussed herein are conventional commercially available adhesives, generally acrylics or epoxies) of FIG. 1, the laminate of the present invention provides:

(1) a lower dielectric constant (2.5);
(2) as good or better peel strength (greater than 8 pli) between the copper and polyimide substrate;
(3) as good or better dimensional stability;
(4) as good or better temperature characteristics; and
(5) higher characteristic impedance.

Moreover, when compared to the polyimide/-fluoropolymer/copper laminate of FIG. 2, the laminate of the present invention
(1) greatly improved bond or peel strength (greater than 8 pli) between the copper and fluoropolymer;
(2) greatly improved dimensional stability;
(3) as good or better temperature characteristics;
(4) as good or better dielectric constant; and
(5) as good or better characteristic impedance.

Finally, when compared to the laminate material of FIG. 3 (and disclosed in U.S. Ser. No. 629,164), the laminate of the present invention should provide:
(1) improved dimensional stability;
(2) reduced thickness and therefore improved flexibility;
(3) lower costs incurred as fluorocarbon coated polyimide is no longer necessary;
(4) improved quality control;
(5) as good dielectric constant; and
(6) as good characteristic impedance.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A laminated circuit material consisting essentially of:
   a first layer of polyimide film;
   a first glass reinforced fluoropolymer adhesive film on said first layer of polyimide film, said glass having a short, noncontinuous configuration; and
   first conductive sheet means disposed on at least a portion of said glass reinforced fluoropolymer adhesive film.

2. The circuit material of claim 1 wherein:
   said first conductive sheet means is copper.

3. The circuit material of claim 1 wherein:
   said glass is microglass.

4. The circuit material of claim 1 wherein:
   said first layer of glass reinforced fluoropolymer adhesive film is between about 25 to about 50 μm in thickness.

5. The circuit material of claim 1 wherein:
   said first layer of glass reinforced fluoropolymer adhesive film is a fluoropolymer film selected from the group comprising a terpolymer of tetrafluoroethylene (TFE), hexafluoropropylene (HFP) and perfluorovinylether (PVE) or a copolymer of TFE and hexafluoropropylene (HFP).

6. The circuit material of claim 5 wherein:
   said first layer of glass reinforced fluoropolymer adhesive film has between about 4 to about 30 weight percent glass.

7. The circuit material of claim 1 wherein:
   said first layer of glass reinforced fluoropolymer adhesive film has between about 4 to about 30 weight percent glass.

8. The circuit material of claim 7 wherein:
   said glass is microglass.

9. The circuit material of claim 1 including:
   a second layer of glass reinforced fluoropolymer adhesive film disposed on at least a portion of said first layer of polyimide film, said glass having a short, noncontinuous configuration; and
   a second sheet of conductive material disposed on said second layer of glass reinforced fluoropolymer adhesive film.

10. The circuit material of claim 9 wherein:
    said conductive material is copper.

11. The circuit material of claim 9 including:
    a third layer of glass reinforced fluoropolymer adhesive film disposed on the side of said first conductive sheet means opposite said first layer of glass reinforced fluoropolymer adhesive film, said glass having a short, noncontinuous configuration; and
    a second layer of polyimide film disposed on said third layer of glass reinforced fluoropolymer adhesive film.

12. The circuit material of claim 11 including
    a fourth layer of glass reinforced fluoropolymer adhesive film disposed on at least a portion of said second layer of polyimide film, said glass having a short, noncontinuous configuration; and
    a third sheet of conductive material disposed on said fourth layer of glass reinforced fluoropolymer adhesive film.

13. The circuit material of claim 1 including:

a second layer of glass reinforced fluoropolymer adhesive film disposed on the side of said first conductive sheet means opposite said first layer of glass reinforced fluoropolymer adhesive film, said glass having a short, noncontinuous configuration; and a second layer of polyimide film disposed on said second layer of glass reinforced fluoropolymer adhesive film.

14. The circuit material of claim 13 including:

a third layer of glass reinforced adhesive film disposed on at least a portion of said second layer of polyimide film, said glass having a short, noncontinuous configuration; and a second sheet of conductive material disposed on said third layer of glass reinforced fluoropolymer adhesive film.

15. The circuit material of claim 14 wherein: said conductive material is copper.

* * * * *